US005666384A

United States Patent [19]
Kuban et al.

[11] Patent Number: 5,666,384
[45] Date of Patent: Sep. 9, 1997

[54] METHOD AND APPARATUS FOR MITIGATING NOISE IN AN OUTPUT SIGNAL OF AN AUDIO AUTOMATIC GAIN CONTROL CIRCUIT

[75] Inventors: Paul A. Kuban, Plainfield; Michael N. Kloos, Elgin; Dien N. Nguyen, Cortland, all of Ill.

[73] Assignee: Motorola, Inc., Schaumburg, Ill.

[21] Appl. No.: 506,942

[22] Filed: Jul. 26, 1995

[51] Int. Cl.⁶ .................................... H04B 15/00
[52] U.S. Cl. .................. 375/285; 455/234.1; 455/245.1; 375/345
[58] Field of Search .................. 375/284, 345, 375/346, 285; 455/245.1, 223, 224, 225, 234.1, 234.2, 116

[56] References Cited

U.S. PATENT DOCUMENTS

| | | | |
|---|---|---|---|
| 3,962,549 | 6/1976 | Zuk | 370/236 |
| 5,299,233 | 3/1994 | Asghar et al. | 375/346 |
| 5,319,573 | 6/1994 | Corleto et al. | 375/346 |
| 5,410,741 | 4/1995 | Cahill et al. | 445/234.1 |
| 5,412,341 | 5/1995 | Walczak | 455/116 |
| 5,448,620 | 9/1995 | Gershkovich et al. | 455/234.1 |

*Primary Examiner*—Wellington Chin
*Assistant Examiner*—Congvan Tran
*Attorney, Agent, or Firm*—Daniel C. Crilly

[57] ABSTRACT

An audio automatic gain control (AGC) circuit (301) employs a method (400, 500) and apparatus (300) for mitigating noise in an output signal (307) of the audio AGC circuit (301). The audio AGC circuit (301) or a circuit coupled to the audio AGC circuit, such as a speech encoder (302), determines (405) whether audio information is present in an input signal (137) to the audio AGC circuit (301). When audio information is not present, the audio AGC circuit (301) applies (411) a gain to the input signal (137) that is less than a current gain being applied, thereby mitigating noise in the audio AGC circuits output signal (220) when audio is not present.

19 Claims, 3 Drawing Sheets

— PRIOR ART —

METHOD AND APPARATUS FOR MITIGATING NOISE IN AN OUTPUT SIGNAL OF AN AUDIO AUTOMATIC GAIN CONTROL CIRCUIT

FIELD OF THE INVENTION

The present invention relates generally to audio automatic gain control (AGC) circuits and, in particular, to mitigating noise in an output signal of an audio AGC circuit.

BACKGROUND OF THE INVENTION

Digital communication system infrastructures are known to include transcoders for compressing and encoding information signals prior to transmission from a base site to a mobile communication unit. The transcoders are similarly used for decoding and expanding information signals received from the communication unit prior to forwarding the information signals to a target unit, such as another mobile communication unit or a public switched telephone network (PSTN) subscriber. Such transcoders typically include an audio automatic gain control (AGC) circuit and a speech encoder in the transmit portion of the transcoder. The audio AGC circuit converts a varying amplitude input signal (e.g., a PSTN signal) into a substantially constant amplitude output signal for further processing by the speech encoder.

Generally, the audio AGC circuit applies a variable gain to its input signal based on the average amplitude level of the input signal with respect to two thresholds. When the average input signal level is greater than a first threshold, but lower than a second threshold, the audio AGC circuit applies a positive gain (amplifies) to the input signal in an attempt to raise the average AGC output signal level to the second threshold. Similarly, when the average input signal level is greater than the first threshold and greater than the second threshold, the audio AGC circuit applies a negative gain (attenuates) to the input signal in an attempt to lower the average AGC output signal level to the second threshold. In both of the above situations, the audio AGC circuit assumes that audio information is primarily responsible for providing the energy that raises the average input signal level above the first threshold. When the average input signal level is less than the first threshold, the audio AGC circuit presumes that the input signal primarily contains noise and simply passes the input signal without performing gain adjustments.

A problem arises due to the AGC circuit's assumption that audio energy is responsible for raising the average amplitude of the input signal above the first threshold. When a PSTN subscriber is conversing with a mobile communication unit, the telephone line can, on occasion, become exceedingly noisy to the extent that the average amplitude of the input signal is between the first and second threshold when the PSTN subscriber is silent (i.e., not talking). During this silent period, the audio AGC circuit still applies a positive gain to the input signal in an attempt to raise the average AGC output signal level to the second threshold, thereby effectively amplifying the noise. The output of the audio AGC circuit is applied to a speech encoder that detects the presence, or absence, of speech and generates a silence message when speech is absent. The silence message instructs the mobile unit to generate background noise in proportion to the AGC circuits output signal level. Thus, when the noise content of the AGC circuits output signal is excessive, the background noise generated at the mobile unit is also excessive, and sometimes annoying to a user of the mobile unit.

Therefore, a need exists for a method and apparatus for mitigating noise in an output signal of an audio AGC circuit that prevents the AGC circuits output signal from containing excessive noise during silent speaking periods.

DESCRIPTION OF A PREFERRED EMBODIMENT

Generally, the present invention encompasses a method and apparatus for mitigating noise in an output signal of an audio automatic gain control (AGC) circuit. The audio AGC circuit or a circuit coupled to the audio AGC circuit, such as a speech encoder, determines whether audio information is present in an input signal to the audio AGC circuit. When audio information is not present, the audio AGC circuit applies a predetermined gain (e.g., 0 decibels (dB)) or a gain less than the gain currently being applied to the input signal to produce the output signal. By applying a gain to the AGC input signal in this manner, the present invention prevents the audio AGC circuit from amplifying the AGC input signal when the AGC input signal primarily comprises noise (i.e., when audio is not present), thereby mitigating the noise in the output signal of the AGC circuit as compared with prior art audio AGC techniques.

Figure 1:
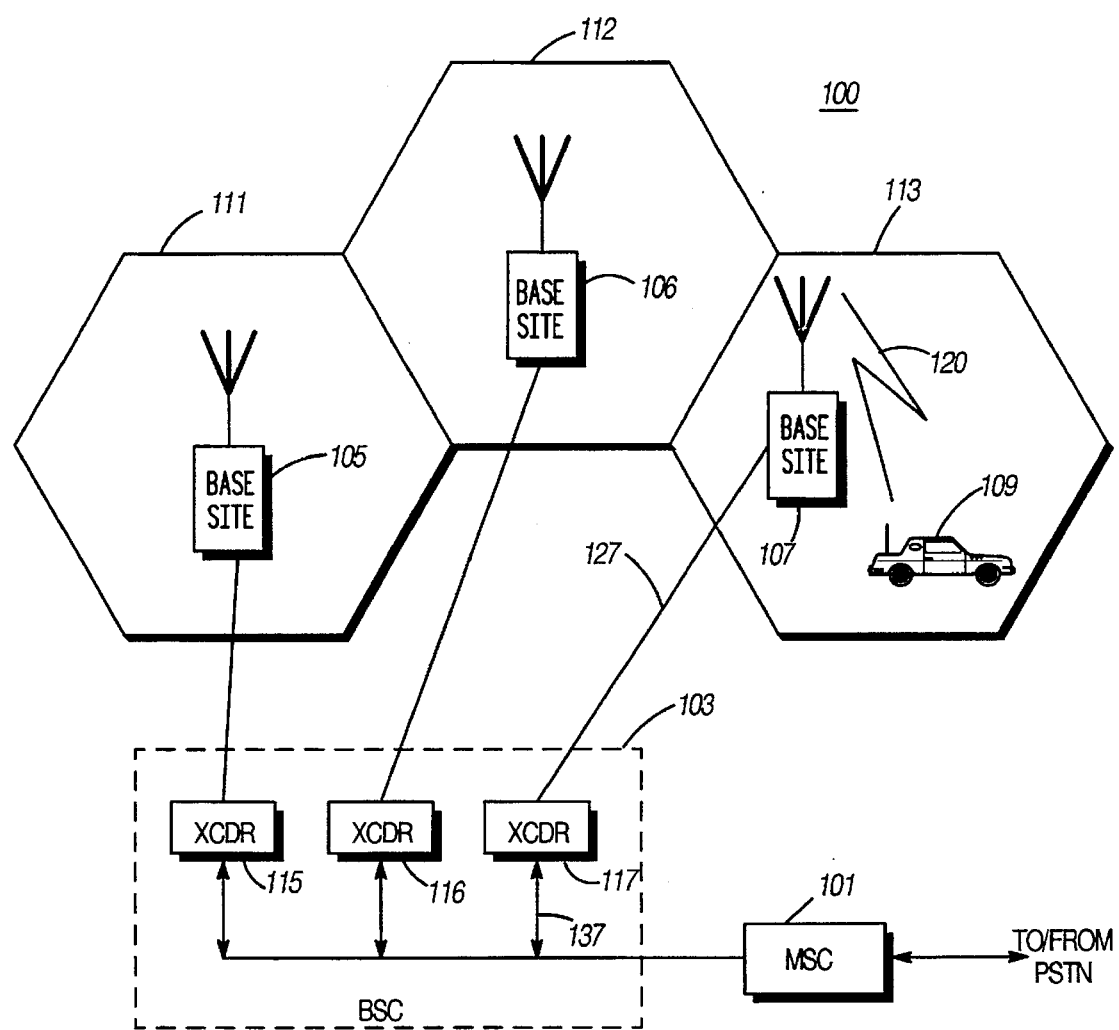
FIG. 1 illustrates a communication system that may beneficially employ the present invention.

The present invention can be more fully described with reference to FIGS. 1–5. FIG. 1 illustrates a radio communication system 100 that may beneficially employ the present invention. The communication system 100 includes a mobile switching center (MSC) 101, a base site controller (BSC) 103, a plurality of base sites 105–107, and at least one communication unit 109. Each base site 105–107 provides communication services to communication units located in its corresponding service coverage area 111–113. The BSC 103 includes a plurality of transcoders (XCDR) 115–117 and preferably controls communications between one or more base sites and the MSC 101. In FIG. 1, the BSC 103 is shown controlling communications between three base sites 105–107 and the MSC 101. Each transcoder 115–117 preferably includes a transmit portion and a receive portion and is coupled to one or more base sites 105–106. In FIG. 1, each transcoder 115–117 is coupled to only one base site 105–107, respectively. The transmit portion of a preferred transcoder 115–117 is described in detail below with regard to FIG. 3. As is also shown, the MSC 101 provides connectivity between the public switched telephone network (PSTN) and the BSC 103.

Operation of the communication system 100 occurs generally as follows. When a PSTN subscriber calls a user of a wireless communication unit (e.g., 109), the PSTN provides a sampled audio signal, such as a pulse code modulated (PCM) signal, to the MSC 101. The MSC 101, which is typically coupled to multiple base site controllers (BSCs), forwards the PCM signal to the appropriate BSC (e.g., 103) based on the communication units registered location, as is well understood in the art. Once the PCM signal 137 arrives at the BSC 103, the BSC 103 selects the appropriate transcoder (e.g., 117) to provide the communication to the base site 107 serving the target communication unit 109. The transmit portion of the transcoder 117 then amplifies or attenuates the input PCM signal 137 based on the PCM signal level and encodes the amplified or attenuated signal in a compressed format to produce a speech encoded output signal 127. In a preferred embodiment, the transcoder encodes the PCM signal 137 using a known vector sum excited linear predictive (VSELP) coding. The encoded signal 127 is provided to the serving base site 107 for modulation and transmission to the target communication unit 109 via a communication resource 120, such as a frequency carrier, time slot, or orthogonal code. Routing of the PCM signal 137 and the speech encoded signal 127 between the PSTN, MSC 101, BSC 103, and base site 107 is accomplished using well-known techniques; thus, no further discussion will be presented.

Figure 2:
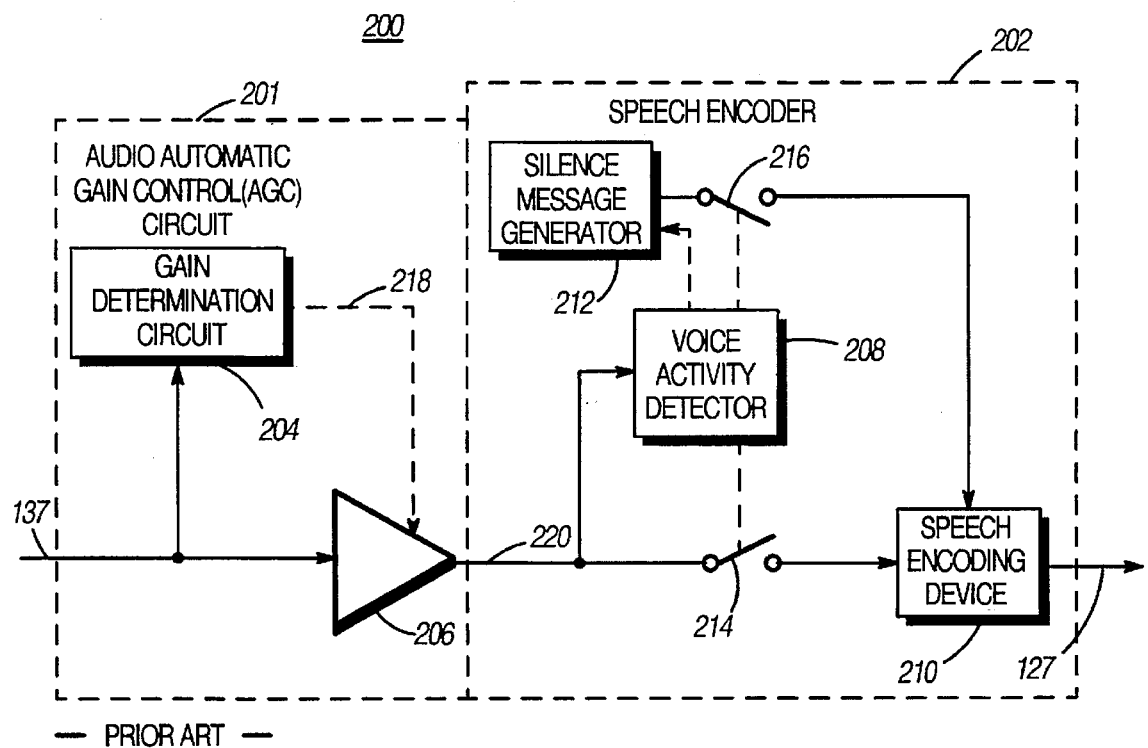
FIG. 2 illustrates a typical transmit portion of a transcoder.

FIG. 2 illustrates a typical transmit portion 200 of a transcoder. The transmit portion 200 includes, inter alia, an audio automatic gain control (AGC) circuit 201 and a speech encoder 202. The audio AGC circuit 201 includes a gain determination circuit 204 and a variable gain amplifier 206. The speech encoder 202 includes a voice activity detector 208, a speech encoding device 210, and a silence message generator 212.

Operation of the typical transcoder transmit portion 200 occurs as follows. The PCM input signal 137 is sampled and applied to the gain determination circuit 204. The gain determination circuit 204 determines an average amplitude of the PCM input signal 137, compares the average amplitude with a first reference, or threshold, level and provides a control signal 218 based on the comparison to the variable gain amplifier 206. If the average amplitude is less than the first threshold level, the gain determination circuit 204 generates a control signal 218 (e.g., a direct current (DC) voltage) that instructs the variable gain amplifier 206 to apply no gain (i.e., 0 dB) to the input signal 137. The variable gain amplifier 206 accordingly applies no gain to the PCM input signal 137 and passes the input signal 137 to the output to produce the audio AGC output signal 220.

If the average amplitude is greater than the first threshold level, the gain determination circuit 204 compares the average amplitude with a second reference, or threshold, level. If the average amplitude is less than the second threshold level, the gain determination circuit 204 provides a control signal 218 (e.g., a positive voltage) to the variable gain amplifier 206 that causes the variable gain amplifier 206 to apply a positive gain to the PCM input signal 137, such that the average amplitude of the AGC output signal 220 approaches the second threshold level. If the average amplitude is greater than the second threshold level, the gain determination circuit 204 provides a control signal 218 (e.g., a negative voltage) to the variable gain amplifier 206 that causes the variable gain amplifier 206 to apply a negative gain to the PCM input signal 137, such that the average amplitude of the AGC output signal 220 approaches the second threshold level. Thus, the audio AGC circuit 201 attempts to produce an output signal 220 with a relatively constant average amplitude for varying amplitude input signals 137.

The PCM input signal 137 typically includes both audio information and noise. When the PSTN subscriber is talking, the PCM input signal 137 primarily comprises audio information; whereas, when the PSTN subscriber stops talking, the PCM input signal 137 primarily comprises noise. When the input signal 137 is primarily audio and the gain determination circuit 204 determines that the average amplitude of the input signal 137 is less than the second threshold level, the variable gain amplifier 206 applies a positive gain to the input signal 137 to produce an output signal 220 having an increased average amplitude of audio information. However, when the input signal 137 is primarily noise and the gain determination circuit 204 determines that the average amplitude of the input signal 137 is less than the second threshold level—as might be the case when the link between the MSC 101 and the PSTN subscriber is particularly noisy, the variable gain amplifier 206 also applies a positive gain to the input signal 137 to produce an output signal 220 having an increased average amplitude of noise.

The voice activity detector 208 samples the AGC output signal 220 and determines whether audio information is present in the AGC output signal 220. Typically, the voice activity detector 208 comprises an audio energy detection circuit that measures the energy of the AGC output signal 220 in an audio bandwidth (e.g., 0–3 KHz) in accordance with known techniques. When audio energy is present in the AGC output signal 220, the voice activity detector 208 sends a control signal (e.g., a DC voltage or a software command) to switch 214 instructing switch 214 to close. The voice activity detector 208 also sends a control signal to switch 216 instructing switch 216 to open, thereby allowing the AGC output signal 220 to pass directly to the speech encoding device 210 (e.g., a VSELP encoder).

Similarly, when audio energy is not present in the AGC output signal 220, the voice activity detector 208 sends control signals to switches 214 and 216 instructing switch 214 to open and switch 216 to close, thereby coupling the silence message generator 212 to the speech encoding device 210. In addition, when audio energy is not present, the voice activity detector 208 sends a digital indication of the measured noise energy in the audio bandwidth to the silence message generator 212. The silence message generator 212 then produces a narrowband digital control message that includes the indication of noise energy and provides the digital control message to the speech encoding device 210. Therefore, the noise energy indication contained in the silence message is, in effect, an indication of the level of noise contained in the AGC output signal 220.

The speech encoding device 210 encodes its input signal (i.e., either the AGC output signal 220 or the silence message) and the transcoder provides the encoded signal 127 to the appropriate base site for transmission to the target communication unit. Upon reception of the encoded signal 127, the communication unit then decodes the encoded signal 127 and provides the audio contained therein to the user of the communication unit or generates background comfort noise proportional to the level of noise energy indicated in the silence message. Therefore, as briefly described in the Background of the Invention above, if the variable gain amplifier 206 had applied a positive gain to an input signal 137 primarily comprised of noise, the comfort noise generated by the target communication unit would be unnecessarily louder than had the variable gain amplifier 206 applied no gain and passed the noisy input signal 137 directly to the voice activity detector 208. The present invention, as further detailed below with regard to FIGS. 3–5, overcomes this audibly annoying deficiency of the prior art.

Figure 3:
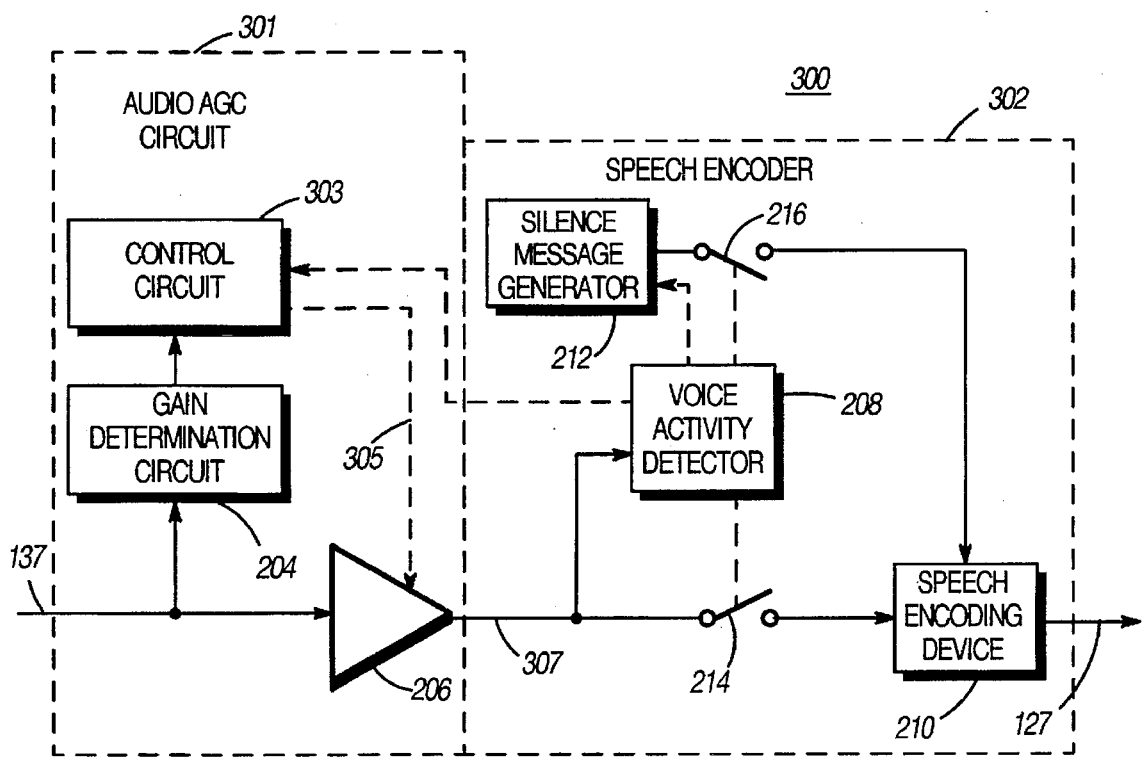
FIG. 3 illustrates a transmit portion of a transcoder in accordance with a preferred embodiment of the present invention.

FIG. 3 illustrates a transmit portion 300 of a transcoder in accordance with a preferred embodiment of the present invention. Like the known transmit portion 200 described above with regard to FIG. 2, the preferred transmit portion 300 includes, inter alia, an audio AGC circuit 301 and a speech encoder 302. However, in contrast to the known transmit portion 200, the preferred transmit portion 300 further includes a control circuit 303 that is coupled to the voice activity detector 208. In the preferred embodiment, the control circuit 303 produces the control signal 305 that is used to adjust the gain of the variable gain amplifier 206. The control circuit 303 is preferably implemented as a software algorithm in a digital signal processor. However, in an alternate embodiment, the control circuit 303 might comprise digital logic circuitry.

Operation of the transcoder transmit portion 300 in accordance with a preferred embodiment of the present invention occurs substantially similar to the operation of the transmit portion 200 of FIG. 2, except that the gain determination circuit 204 provides the gain of the average input signal amplitude with respect to the second threshold level to the control circuit 303 and the voice activity detector 208 provides an indication of whether audio information is present in the AGC output signal 220 to the control circuit 303. That is, the gain determination circuit 204 determines whether the average amplitude of the input signal 137 has a positive or negative gain with respect to the second threshold level (i.e., is above or below the second threshold) and provides the gain of the average amplitude to the control circuit 303. The variable gain amplifier 206 then applies a first gain to the input signal 137 (e.g., the previously set gain or a predetermined fixed gain, such as 0 dB) to produce the AGC output signal 307. The voice activity detector 208 measures the audio energy in the AGC output signal 307 and feeds an indication (e.g., a digital word) of the audio energy back to the control circuit 303. The control circuit 303 then produces the variable gain amplifier's control signal 305 based on the inputs from the gain determination circuit 204 and the voice activity detector 208. In response to the control signal 305, the variable gain amplifier 206 applies either the original first gain or a second gain to the input signal 137 to produce the AGC output signal 307.

For example, when the gain determination circuit 204 determines that the average amplitude of the input signal 137 is above the first threshold level, but below the second threshold level (i.e., when the average amplitude of the input signal 137 has a small negative gain with respect to the second threshold level), the gain determination circuit 204 computes the positive gain to be applied to the input signal 137 by the variable gain amplifier 206 to raise the average amplitude of the input signal 137 approximately to the second threshold level and provides the positive gain value to the control circuit 303. The variable gain amplifier 206 amplifies the input signal 137 with its previously set, or first, gain to produce the AGC output signal 307. The voice activity detector 208 determines the audio energy in the AGC output signal 307 and sends an indication of whether or not audio information is present in the AGC output signal 307 to the control circuit 303. The indication preferably comprises a binary indication (e.g., a one to indicate the presence of audio and a zero to indicate the absence of audio), although other indications, such as audio energy level, might be used alternatively. It should be noted that although the voice activity detector 208 in the preferred embodiment actually determines whether audio information is present in the AGC output signal 307, such a determination correlates directly with a determination of whether audio information is present in the AGC input signal 137. That is, if audio information is present in the AGC output signal 307, then audio information must be present in the AGC input signal 137.

When the gain determination circuit 204 determines that a positive gain must be applied to the input signal 137 and the voice activity detector 208 detects audio information present in the AGC output signal 307, the control circuit 303 sends a control signal 305 (e.g., an analog or digital voltage) to the variable gain amplifier 206 that instructs the variable gain amplifier 206 to apply the appropriate positive gain. However, when the gain determination circuit 204 determines that a positive gain must be applied to the input signal 137 and the voice activity detector 208 does not detect audio information present in the AGC output signal 307, the control circuit 303 sends a control signal 305 to the variable gain amplifier 206 that instructs the variable gain amplifier 206 to reduce its gain (i.e., apply a second gain) if its current (i.e., first) gain is positive, thereby mitigating the noise contained in the AGC output signal 307. In a preferred embodiment, when no audio is present, the control circuit 303 instructs the variable gain amplifier 206 to apply a predetermined gain (e.g., 0 dB) to the AGC input signal 137. If no audio is present and the variable gain amplifier 206 is currently applying a negative gain, the control circuit 303 might instruct the variable gain amplifier 206 to maintain its current gain or apply a predetermined negative gain.

When the gain determination circuit 204 determines that a negative gain must be applied to the input signal 137 and the voice activity detector 208 detects audio information present in the AGC output signal 307, the control circuit 303 instructs the variable gain amplifier 206 to apply the negative gain computed by the gain determination circuit 204. However, when the gain determination circuit 204 determines that a negative gain must be applied to the input signal 137 and the voice activity detector 208 does not detect audio information present in the AGC output signal 307, the control circuit 303 might send a control signal 305 to the variable gain amplifier 206 that instructs the variable gain amplifier 206 to apply either the gain computed by the gain determination circuit 204 or a predetermined negative gain to the input signal 137, wherein the predetermined negative gain is less than the gain computed by the gain determination circuit 204.

It should be noted that although the above discussion has focused on mitigating noise in the output signal of an audio AGC circuit 301 contained in a transcoder, the present invention is equally applicable to mitigating noise present in the output signal of any audio AGC circuit. For example, the present invention may be used advantageously to mitigate noise in the output signal of an audio AGC circuit used in a digital interface unit that digitally encodes voice from an analog console station prior to transmission over a conventional or trunked digital communication system. In addition, although the voice activity detector 208 is shown in FIG. 3 as being preferably placed after the variable gain amplifier 206 in the speech encoder 302, the voice activity detector 208 may alternatively be placed before the variable gain amplifier 206 (e.g., within the audio AGC circuit 301) to detect the voice activity of the audio AGC input signal 137 directly.

Thus, as described above, the present invention applies gain to an audio AGC circuits input signal based on whether or not audio information is present in the input signal. When audio information is not present, the audio AGC circuit applies a gain to the input signal that is less than the current gain, particularly when the current gain is positive. By applying a smaller gain when no audio is present, the present invention mitigates the noise in the audio AGC circuit's output signal and correspondingly in the audio comfort noise produced by the target communication unit in response to the silence message. By contrast, prior art audio AGC circuits do not base the gain applied to the AGC circuits input signal on the presence of audio information in the input signal. Thus, prior art circuits apply positive gains when both audio is not present and noise levels are severe, thereby resulting in excessive background noise levels in target communication units.

Figure 4:
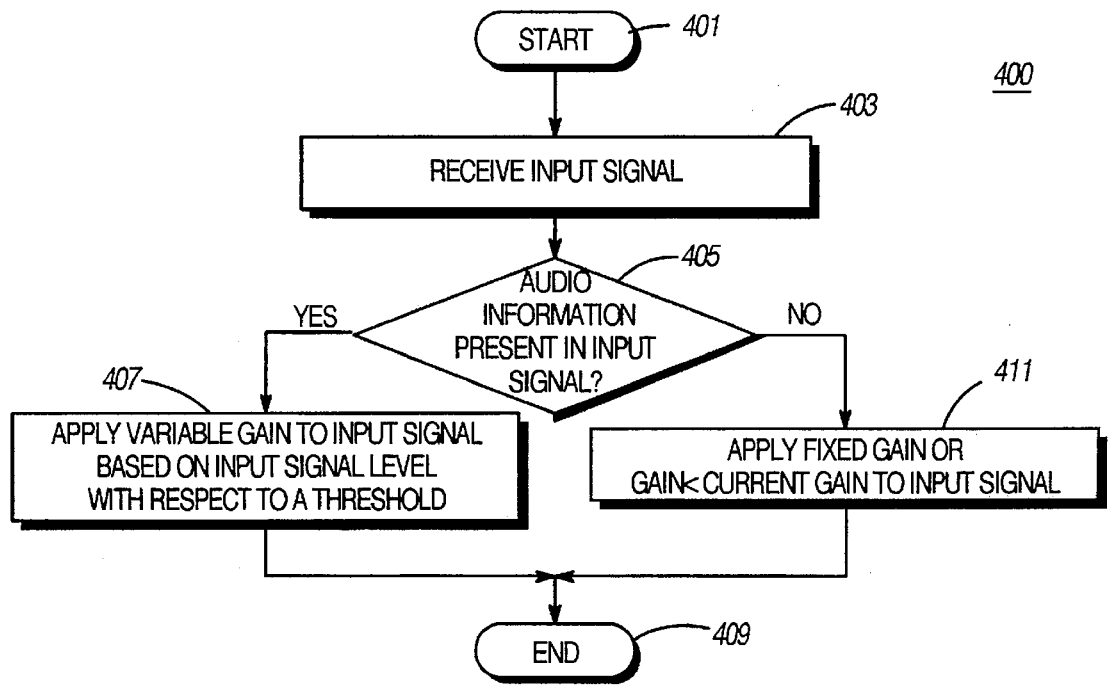
FIG. 4 illustrates a logic flow diagram of steps executed to mitigate noise in an output signal of an audio AGC circuit in accordance with the present invention.

FIG. 4 illustrates a logic flow diagram 400 of steps executed to mitigate noise in an output signal of an audio AGC circuit in accordance with the present invention. The logic flow begins (401) when the audio AGC circuit receives (403) an input signal, wherein the input signal includes both audio information and noise or only noise. The audio AGC circuit then determines (405) whether audio information is present in the input signal. This determination preferably comprises receiving an indication from a supplemental circuit, such as a speech encoder, of whether or not audio information is present in the output signal of the audio AGC circuit. However, the determination might alternatively comprise measuring the audio energy (i.e., voice activity) present in the input signal directly.

When audio information is present in the input signal, the AGC circuit applies (407) a variable gain to the input signal based on the input signal's level with respect to a reference threshold or thresholds. That is, when audio information is present and the input signal level is below the reference threshold (e.g., the second threshold described above with respect to FIGS. 2 and 3), the AGC circuit applies a positive gain (i.e., amplifies) to the input signal such that the AGC circuits output signal level approaches the reference threshold. In an analogous manner, when audio information is present and the input signal level is above the reference threshold, the AGC circuit applies a negative gain (i.e., attenuates) to the input signal such that the AGC circuit's output signal level approaches the reference threshold. Once the AGC circuit applies the appropriate gain to the input signal, the logic flow ends (409).

When audio information is not present in the input signal, the AGC circuit applies (411) either a fixed gain or a gain less than the current gain to the input signal. For example, if the AGC circuit is currently applying a positive gain (e.g., 3 dB) to the input signal and audio information is not present in the input signal, the AGC circuit then applies either a fixed gain (e.g., 0 dB) or a gain less than the current gain (e.g., 1 dB) to the input signal to reduce the noise content in the AGC circuit's output signal. In a similar manner, if the AGC circuit is currently applying a negative gain (e.g., −1 dB) to the input signal and audio information is not present in the input signal, the AGC circuit might apply either a fixed gain (e.g., −3 dB) or a gain less than the current gain (e.g., −2 dB) to the input signal. Once the AGC circuit applies the appropriate gain to the input signal, the logic flow ends (409).

Figure 5:
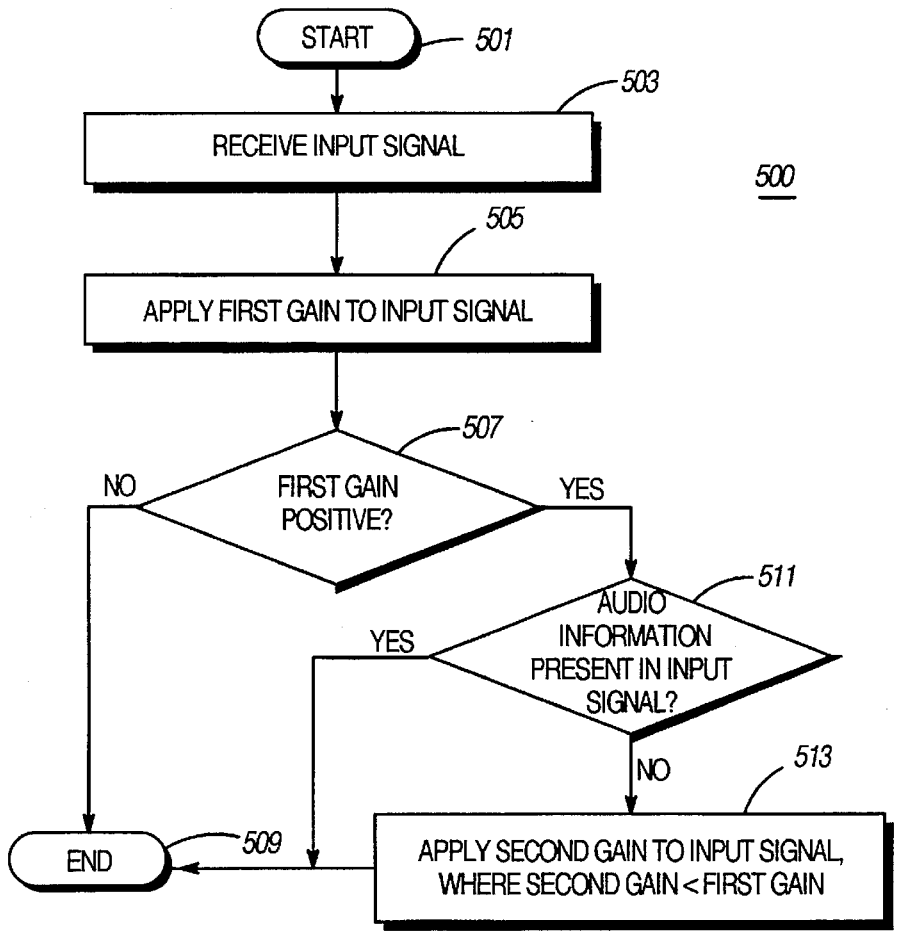
FIG. 5 illustrates a logic flow diagram of steps executed to mitigate noise in an output signal of an audio AGC circuit in accordance with a preferred embodiment of the present invention.

FIG. 5 illustrates a logic flow diagram 500 of steps executed to mitigate noise in an output signal of an audio AGC circuit in accordance with a preferred embodiment of the present invention. The logic flow begins (501) when the audio AGC circuit receives (503) an input signal that includes both audio information and noise, or noise only, and applies (505) a first gain to the input signal based on the input signal's level with respect to a reference threshold. The audio AGC circuit then determines (507) whether the first gain is positive. The determination whether the first gain is positive is preferably performed by comparing the input signal level to the reference threshold. If the input signal level is less than the reference threshold (e.g., the second threshold described above with respect to FIGS. 2 and 3), the first gain is positive; whereas, if the input signal level is greater than the reference threshold, the first gain is negative.

If the first gain is not positive, the AGC circuit continues to apply the first gain to the input signal and the logic flow ends (509). If the first gain is positive, the AGC circuit determines (511) whether audio information is present in the input signal by determining whether audio information is present in the output signal. That is, a circuit subsequent to the AGC circuit (e.g., a speech encoder) determines whether there is voice activity in the AGC output signal and feeds an indication of the voice activity back to the audio AGC circuit. If the indication suggests that audio information is present in the output signal, the audio AGC circuit determines that audio information is also present in the input signal and the logic flow ends (509). If, however, the indication suggests that audio is not present in the output signal, the audio AGC circuit applies (513) a second gain to the input signal, wherein the second gain is less than the first gain to reduce the level of noise in the AGC output signal. In a preferred embodiment, the second gain is a predetermined gain of zero decibels.

The present invention encompasses a method and apparatus for mitigating noise in an output signal of an audio automatic gain control (AGC) circuit. With this invention, a speech encoder coupled to the audio AGC circuit can produce a silence message during periods of voice inactivity that instructs a mobile communication unit to produce comfortable levels of background noise at the mobile unit even though excessive noise is contained in the audio AGC input signal. By applying gain to an input signal based on its audio information content, the present invention reduces the level of noise in the AGC output signal when the input signal primarily comprises noise, in contrast to prior art approaches that continue applying positive gain when noisy input links have amplitudes that suggest audio information is present. Further, in addition to improving the audible noise levels present in mobile units during silent speech periods, the present invention is also applicable to various other audio AGC applications, such as analog console digital interface units and digital speech compressors.

While the present invention has been particularly shown and described with reference to particular embodiments thereof, it will be understood by those skilled in the art that various changes in form and details may be made therein without departing from the spirit and scope of the present invention.

What we claim is:

1. A method for mitigating noise in an output signal of an audio automatic gain control circuit, the method comprising the steps of:

determining whether audio information is present in an input signal to the audio automatic gain control circuit;

determining, by the audio automatic gain control circuit, whether a current gain being applied to the input signal is positive; and when audio information is not present in the input signal and the current gain is positive, applying, by the audio automatic gain control circuit, a gain to the input signal that is less than the current gain to produce the output signal.

2. The method of claim 1, wherein the step of determining whether audio information is present in the input signal comprises the step of determining voice activity in the output signal of the audio automatic gain control circuit to estimate the presence of audio information in the input signal.

3. The method of claim 1, wherein the input signal comprises a sampled audio signal from a switched telephone network.

4. The method of claim 3, wherein the sampled audio signal comprises a pulse-code modulation signal.

5. The method of claim 1, wherein the gain applied to the input signal is less than or equal to zero decibels.

6. The method of claim 1, wherein the step of determining whether the current gain is positive comprises the steps of:

comparing an amplitude of the input signal to a first threshold and a second threshold; and when the amplitude exceeds the first threshold and is less than the second threshold, determining that the current gain is positive.

7. A method for mitigating noise in an output signal of an audio automatic gain control circuit, the method comprising the steps of:

determining whether audio information is present in an input signal to the audio automatic gain control circuit;

determining, by the audio automatic gain control circuit, whether the audio automatic gain control circuit is to apply a positive gain to the input signal; and when audio information is not present in the input signal and a positive gain is to be applied to the input signal, applying, by the audio automatic gain control circuit, a predetermined gain to the input signal to produce the output signal.

8. The method of claim 7, wherein the step of determining whether audio information is present in the input signal comprises the step of determining voice activity in the output signal of the audio automatic gain control circuit to estimate the presence of audio information in the input signal.

9. The method of claim 7, wherein the predetermined gain is zero decibels.

10. A method for mitigating noise in an output of an audio automatic gain control circuit, the method comprising the steps of:

receiving, by the audio automatic gain control circuit, an input signal;

applying, by the audio automatic gain control circuit, a first gain to the input signal to produce an audio output signal;

determining whether audio information is present in the audio output signal; and when audio information is not present in the audio output signal, applying, by the audio automatic gain control circuit, a second gain to the input signal, wherein the second gain is less than the first gain.

11. The method of claim 10, wherein a speech encoder is coupled to an output of the audio automatic gain control circuit and wherein the step of determining whether audio information is present in the audio output signal comprises the step of determining, by the speech encoder, voice activity in the audio output signal.

12. The method of claim 10, further comprising the step of determining, by the audio automatic gain control circuit, whether the first gain is positive; and wherein the step of applying the second gain to the input signal comprises the step of applying the second gain to the input signal when audio information is not present in the audio output signal and the first gain is positive.

13. The method of claim 12, wherein the step of determining whether the first gain is positive comprises the steps of:

comparing an amplitude of the input signal to a first threshold and a second threshold; and when the amplitude exceeds the first threshold and is less than the second threshold, determining that the first gain is positive.

14. An apparatus for mitigating noise in an output signal of an audio automatic gain control circuit, the apparatus comprising:

an amplifier that applies a gain to an input signal of the audio automatic gain control circuit based on a control signal;

a voice activity detector, coupled to an output of the amplifier, that produces an indication of whether audio information is present in the input signal to the audio automatic gain control circuit; and a control circuit, coupled to the voice activity detector and the amplifier, that produces the control signal based on the indication of whether audio information is present in the input signal.

15. The apparatus of claim 14, wherein the control circuit is implemented as a software algorithm in a digital signal processor.

16. The apparatus of claim 14, wherein the voice activity detector comprises an audio energy detection circuit.

17. An apparatus for mitigating noise in an output signal of an audio automatic gain control circuit, the apparatus comprising:

a gain determination circuit that estimates an average amplitude of an input signal to the audio automatic gain control circuit and determines a gain of the average amplitude with respect to a reference level;

a variable gain amplifier that applies a gain to the input signal based on a control signal to produce the output signal for the audio automatic gain control circuit;

a voice activity detector, coupled to an output of the variable gain amplifier, that produces an indication of whether audio information is present in the output signal; and a control circuit, coupled to the gain determination circuit, the variable gain amplifier, and the voice activity detector, that produces the control signal based on the gain of the average amplitude with respect to the reference level and the indication of whether audio information is present in the output signal.

18. A transcoder in a radio communication system, the transcoder comprising:

an audio automatic gain control circuit, comprising:

a gain determination circuit, that estimates an average amplitude of an input signal to the transcoder and determines a gain of the average amplitude with respect to a reference level;

a variable gain amplifier that applies a gain to the input signal based on a control signal to produce an output signal of the audio automatic gain control circuit; and a control circuit, coupled to the gain determination circuit and the variable gain amplifier, that produces the control signal based on the gain of the average amplitude with respect to the reference level and an indication of whether audio information is present in the output signal of the audio automatic gain control circuit; and a speech encoder, coupled to the control circuit and an output of the variable gain amplifier, that produces the indication of whether audio information is present in the output signal of the audio automatic gain control circuit.

19. The transcoder of claim 18, wherein the speech encoder is a vector sum excited linear predictive speech encoder.

\* \* \* \* \*